Aug. 17, 1971 S. LEVINOS 3,600,173

PHOTOELECTROPOLYMERIZATION

Filed June 13, 1967

INVENTOR.
Steven Levinos

United States Patent Office 3,600,173
Patented Aug. 17, 1971

3,600,173
PHOTOELECTROPOLYMERIZATION
Steven Levinos, Vestal, N.Y., assignor to GAF Corporation, New York, N.Y.
Filed June 13, 1967, Ser. No. 645,768
Int. Cl. G03c 5/00
U.S. Cl. 96—35.1 20 Claims

ABSTRACT OF THE DISCLOSURE

Method of photoelectropolymerization wherein incident light energy is converted to electrical energy in accordance with image being reproduced, said electrical energy being utilized to generate an electric current in an electrically conductive vinyl monomer layer and wherein generation of polymerization catalyst occurs electrolytically thereby leading to formation of a polymeric resist-image in accordance with the electrical energy, the catalyst generating material comprising a fluoborate or fluosilicate salt of a light-sensitive diazotized primary aromatic amine.

Figure 1:
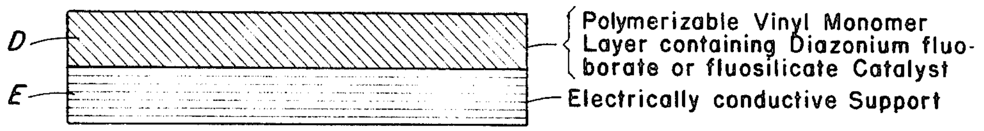

The present invention relates in general to the formation of solid polymers and more particularly, to a novel process for the production of polymeric resist images by a catalytically induced polymerization of a normally liquid to a normally solid monomeric vinyl compound.

It is well known that the polymerization of certain ethylenically unsaturated organic compounds, more commonly referred to as vinyl monomers, can be initiated by exposure to high intensity radiation to yield thereby a high molecular weight product. Thus, it is known that methyl acrylate on long standing in the sunlight, is transformed into a transparent, odorless mass of density 1.22 and, in this connection, reference is made to Ellis', "The Chemistry of Synthetic Resins" (Vol. 2), 1935, page 1072. Photography and the related fields of photolithography have proved to be particularly useful areas for the application of radiant energy to effect polymerization of vinyl monomer compositions. The general procedure involved comprises coating a suitable base or support with a polymerizable compound such as a monomer or mixtures of monomers followed by exposure through a pattern to a high intensity light source. In the exposed areas, the monomer is polymerized to a more or less hard and insoluble mass, depending upon the intensity of exposure, whereas the unexposed areas comprising substantially the original monomer(s) can be readily removed in most cases by a simple washing operation. There remains in the exposed areas a resist of insoluble polymer material.

Since the polymerization reaction characterizing such systems would ordinarily lack the requisite speed necessary for feasible commercial practice, the use of polymerization aids, e.g., photo-initiators, promoters, sensitizers and the like, is a recognized necessity. The absence of one or more of such auxiliary agents will invariably lead to the formation of only low molecular weight polymers.

Despite the relatively widespread commercial success of the photopolymerization process in the photo-reproduction industry, certain difficulties are nevertheless repeatedly encountered and especially in connection with attempts to provide photopolymerizable monomer compositions possessing optimum spectral response, i.e., speed. It is commonly found that successful implementation of the photopolymerization technique which requires the formation of polymers of sufficient toughness and film strength, necessitates the use of inordinately long exposures and/or sources of high intensity radiation.

As will be readily apparent such a process depends critically for its success upon the photolytic effects of actinic radiation, i.e., the polymer-forming reaction results from the effects of light upon radiation sensitive monomer/catalyst systems. The rate and thus extent of polymer formation will primarily depend upon the amount of catalyst, e.g., free radicals, generated during the photolytic decomposition of the catalyst-liberating material which in turn depends upon the intensity of exposure to which the area in question is subjected. Several disadvantages are inherent in such a system. Firstly, the effective photographic speed of a given radiation sensitive catalyst/monomer system can be enhanced only by suitable adjustment of the radiation source itself (intensity) or by increasing the duration of exposure (time). This, of course, necessarily imposes certain conditions on the process equipment which can be effectively employed, e.g., the type of light source. Of paramount significance from a commercial standpoint, however, is the fact that the use of high intensity radiant energy sources invariably leads to defective image reproduction as well as other deleterious effects. For example, high intensity radiation sources of the type required in photopolymerization methods currently known produce large quantities of infra-red and heat rays which, as is well known, can exert catalytic effects and thus initiate as well as accelerate certain types of polymerizations. As a consequence, a certain portion of the monomer composition may be polymerized due to thermal effects alone which, of course, would tend to prohibit the production of a clean relief image. For example, should a black and white silver halide negative pattern be employed, it is obvious that no polymer should form in areas correspondding to the dark portions of the negative pattern. However, such a result may nevertheless occur since the dark portions of the negative may well absorb significant amounts of the radiant heat energy given off by the light source to an extent sufficient to effect thermal polymerization of monomer in the non-image areas. Consequently, in those systems which utilize a light source having an appreciable radiant heat output, serious problems may arise in connection with the quality of resist images reproduced.

In an effort to overcome or otherwise alleviate the foregoing and related problems, considerable industrial activity has centered around the research and development of new and more efficient catalyst systems, i.e., photoinitiators, as well as catalyst promoters, sensitizing agents and the like. In addition, a substantial number of monomer systems have been provided heretofore which purportedly exhibit a marked improvement in spectral response thereby providing more feasible polymerization rates.

However, in the vast majority of instances, the innovations thus far evolved have provided only marginal advantage in such vital aspects as speed, image quality, etc., the latter shortcomings being particularly manifest in connection with photopolymerization techniques based upon the use of low energy radiation sources. For example, in an effort to extend as well as augment the spectral sensitivity of the known catalyst monomer systems which in many instances exhibit optimum response to but limited regions of the spectrum, it has been suggested to incorporate therein one or more sensitizing dyes. Since these materials, being dyestuffs, are only partially absorptive in the visible spectrum, the photopolymerizable composition will often be colored thereby. The consequences involved are self-evident. Furthermore, the increased costs involved in implementing such techniques have tended to retard any significant degree of commercial exploitation.

In co-pending application, Ser. No. 616,977 filed Feb. 17, 1967, there is described a process for the formation of a polymeric resist image characterized in that the imagewise generation of catalyst, i.e., polymerization initiating species in the polymerizable monomer layer proceeds according to a reaction which is essentially electrolytic as distinguished from photolytic in nature, the activating influence being an electric current generated in accordance with a light pattern incident upon a photoconductive layer situated in electrically conducting contact with the polymerizable layer. Thus, the photoconductive layer functions to convert the electromagnetic radiation incident thereupon to electric current which is conducted through the corresponding portions of the subjacent polymerizable monomer layer. The monomer layer comprises as essential ingredients the monomer component and a catalyst progenitor comprising a compound which undergoes electrolysis with the formation of species capable of initiating vinyl monomer polymerization said catalyst progenitor comprising a radiation sensitive diazotized primary aromatic amine. The salient advantage presented by the aforedescribed process resides in the heretofore unattainable reduction in exposure time necessary for production of a satisfactory polymeric resist image.

In accordance with the discovery forming the basis of the present invention, it has been ascertained that the employment of the radiation sensitive diazotized primary aromatic amine in the form of a specific stabilized salt makes possible the obtention of even greater reduction in required exposure time, i.e., to an extent which must be considered highly surprising.

Thus, a primary object of the present invention resides in the provision of a method for effecting the imagewise polymerization of a vinyl monomer layer which is not subject to the limitation and disadvantages characterizing known processes based upon photopolymerization techniques.

Another object of the present invention resides in the provision of a high-speed method for forming a polymeric resist by the image-wise polymerization of a vinyl monomer layer wherein the exposure intervals required for resist formation are reduced significantly.

A further object of the present invention resides in the provision of a method for forming a polymeric resist image wherein the polymer-forming reaction is virtually independent of the photolytic effects of actinic radiation.

A still further object of the present invention resides in the provision of polymeric resist elements characterized by outstanding improvement in reproduction quality.

Other objects and advantages of the present invention will become more apparent hereinafter as the descripiton proceeds.

The attainment of the foregoing and related objects is made possible in accordance with the present invention which in its broader aspects includes the provision of a process for the formation of a polymer resist image characterized in that the imagewise generation of catalyst, i.e., polymerization-initiating species in the polymerizable monomer layer proceeds according to a reaction which is essentially electrolytic as distinguished from photolytic in nature, the activating influence being an electric current generated in accordance with a light-pattern incident upon a photoconductor layer situated in electrically conducting contact with said polymerizable monomer layer. More specifically, the present invention provides a process for the preparation of a polymeric image wherein polymer formation is controlled in accordance with an imagewise conductivity pattern said process comprising exposing a photoconductor layer having a high dark resistivity to electromagnetic radiation having a wave length extending from the ultra-violet to the visible region whereby said photoconductor layer is rendered capable of conducting an electric current in the exposed areas, said photoconductor layer being disposed in electrically conducting contact with a vinyl monomer layer coated on an electrically conductive support, said monomer layer comprising (a) a normally liquid to normally solid vinyl monomer containing the grouping $CH_2=C<$ attached directly to an electro negative group and (b) a catalyst progenitor comprising a compound which undergoes electrolysis with the formation of species capable of initiating the polymerization of said vinyl monomer, said catalyst progenitor comprising a compound selected from the group consisting of the fluoborate and fluosilicate salts of a radiation sensitive diazotized primary aromatic amine and wherein an electrical potential difference is maintained across said photoconductor layer and said conductive support throughout the exposure interval, said potential difference being substantially uniformly distributed over each of said photoconductor layer and said conductive support whereby current is caused to flow through said monomer layer thereby effecting polymerization of said vinyl monomer layer in areas of said photoconductor layer.

The method or process by which the present invention can be readily implemented can perhaps best be understood by reference to the accompanying drawing. However, it will be understood that the arrangemnt of parts depicted therein is given for purposes of illustration only and thus is in no way to be regarded as being limitative.

Figure 2:
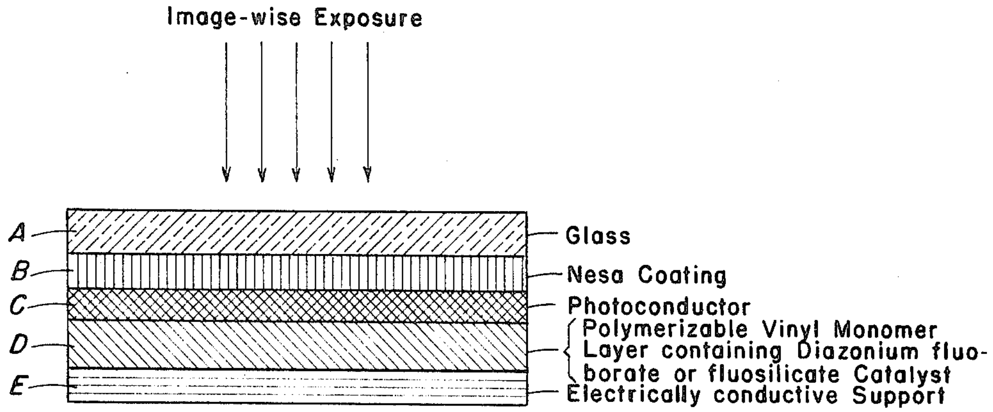

FIG. 1 illustrates one type of resist-forming element applicable to the process of the present invention while FIG. 2 illustrates a fundamental arrangement by which the electrolytically induced polymerization of the present invention may be readily achieved.

In FIG. 1, E represents an electrically conducting support and D represents the polymerizable vinyl monomer layer, i.e., the resist-forming layer containing the diazonium fluoborate or fluosilicate catalyst progenitor. In FIG. 2, A represents a glass layer provided with a conductive coating B such as tin oxide and C represents a photoconductor layer of high dark resistivity such as ZnO, ZnS or the like.

In actual operation, a D.C. voltage supply is connected across layers B (cathode) and E (anode) thereby creating a substantially, uniformly distributed electrical difference in potential across said anode and cathode layers. Without illumination, current of only a few microamperes which would in any case be insufficient to initiate polymerization flows through the system due to the high dark resistivity of the photoconductor layer. When exposed to a light pattern, however, an imagewise conductivity pattern is formed in the photoconductor layer which causes a corresponding increase in the flow of current between the cathode and anode to an extent sufficient to initiate the electrolysis reaction in monomer layer D whereby the diazotized primary aromatic amine is converted into a species which initiates polymerization.

One of the truly outstanding features characterizing the process of the present invention relates to the fact that exceptionally high-speed imagewise polymerizations are readily obtainable notwithstanding the use of minimal exposure levels, i.e., exposure which would require the use of either ultra high-intensity radiation sources or conversely, intolerably protracted time intervals if polymerization were to be effected to the same extent by utilizing photolytic methods of resist formation, i.e., wherein the polymerization reaction is a direct function of the light energy absorbed in the monomer layer. In contradistinction, the exposure required in practicing the present invention comprises but a fraction of that required in photolytic polymerization and need only be that necessary to render the photoconductor layer B conductive. Once the photoconductor material is excited in accordance with the light pattern impressed thereupon, a copious source of polymerization catalyst can be assured by merely controlling the current density, this being easily accomplished by suitable adjustment of the voltage impressed across the anode and cathode terminals. Since the catalyst-liberating electrolysis reaction in the monomer layer is a direct function of the number of coulombs impressed upon the system, means is thus provided for controlling the catalyst producing reaction rate and, concomitantly the rate of polymer formation virtually independent of the strength of the exposure radiation.

In photochemical methods of photopolymerization the exposure radiation performs a dual function, i.e., it provides both the information to be reproduced in the form of a light pattern and, in addition, represents both the ultimate and direct source of energy by which the catalyst-generating reaction is initiated. In contradistinction, the function of the exposure illuminant in the present invention is solely to supply the information desired to be reproduced in polymeric resist form, the direct energy source responsible for initiating the catalyst liberating reaction being the electric current conducted by those portions of the photoconductive layer activated by the exposure radiation. In this respect, the use of electrical energy to produce the polymerization initiating species constitutes an amplification function, i.e., the image to be reproduced, though optically sensed initially by the photoconductive layer, is transmitted to the polymerizable monomer layer in the form of an amplified electric current. As will be readily apparent, this affords considerable latitude with regard to controlling the parameters which influence the polymerization reaction rate.

In co-pending application Serial No. 616,977 there is described a process for the formation of polymeric resists based upon the use of catalyst systems comprising a radiation sensitive diazotized primary aromatic amine. The compounds contemplated for such purposes encompass a relatively wide range; for example, diazotized derivatives of the following aromatic amines perform quite satisfactorily.

p-4-morpholinylaniline
4-amino caprylanilide (or 4-caprylamido aniline)
5-stearamido orthanilic acid
5-lauramido anthranilic acid
3-amino-4-methoxydodecanesulfonanilide
4-diethylaminoaniline
2-ethoxy-4-diethylaminoaniline
5-dimethylamino orthanilic acid
4-cyclohexylaminoaniline
4-(di-β-hydroxyethylamino) aniline
4-piperidinoaniline
4-thiomorpholinoaniline
4-hydroxyaniline
3-methyl-4-ethylaminoaniline
4-aminodiphenylamine
3-methyl-4-(β-hydroxyethylamino) aniline
5-amino salicyclic acid
o-pentadecoxyaniline
N-β-hydroxyethyl-N-ethyl-p-phenylene diamine
Benzidine-2,2′-disulfonic acid
2,5-dichloro-1-amino-benzene
4-chloro-2-amino-1-methylbenzene
4-chloro-2-amino-1-methoxy benzene
2,5-dichloro-1-methyl-4-aminobenzene
2-amino-4-methoxy-5-benzoylamino-1-chlorobenzene
2,5-dichloro-4-amino-1-methylbenzene
4,6-dichloro-2-amino-1-methylbenzene
4-amino-1,3-dimethylbenzene
4,5-dichloro-2-amino-1-methylbenzene
5-nitro-2-amino-1-methylbenzene
5-nitro-2-amino-1-methoxybenzene
3-amino-4-methoxy-6-niro-1-methylbenzene
3-amino-4-methoxy-6-benzoylamino-1-methylbenzene
6-amino-4-benzoylamino-1,3-dimethoxybenzene
6-amino-3-benzoylamino-1,4-diethoxybenzene
6-amino-3-benzoylamino-4-ethoxy-1-methoxybenzene
6-amino-3-benzoylamino-1,4-dimethoxybenzene
p-amino-diphenylamine
p-phenylenediamine-monosulfo acid
p-ethylamino-m-toluidine
N-benzyl-N-ethyl-p-phenylenediamine
p-dimethylamino-o-toluidine
p-diethylamino-o-phenetidine
4-benzoylamino-2,5-diethoxyaniline
2-amino-5-dimethylamino-benzoic acid
N,N-di(β-hydroxyethyl)-p-phenylenediamine
p-(N-ethyl-N-β-hydroxyethylamino)-o-toluidine
p-di-β-hydroxyethylamino-o-chloraniline
p-phenylenediamine
2,5-diethoxy-4-(4′-ethoxyphenylamino)-aniline
p-1-pipyridylaniline
α and β naphthyl amines As explained in the afore-referenced application, the light-sensitive diazotized primary aromatic amines are uniformly characterized in that their electrolysis reaction includes the formation of species capable of initiating the polymerization of ethylenically unsaturated organic compounds commonly referred to as vinyl monomers. By way of hypothesis, the reaction mechanism postulated in explanation of the catalyst-generating reaction is that the imagewise conductivity pattern established across the vinyl monomer layer containing the diazonium catalyst progenitor initiates a current flow which, via electrolysis of the moisture contained in the coating results in the imagewise generation of base, i.e., hydroxyl ion the concentration distribution of such base being a direct function of the point-to-point current density. The generation of free radical species thereafter occurs by reaction of hydroxyl ion with the diazonium compound to form the corresponding diazo hydroxide the latter in turn dissociates to yield a phenyl free radical, a hydroxyl free radical and nitrogen.

The reaction involved can be illustrated by the following equations:

(1)

$$C_6H_5{=}\overset{+}{N}{=}N \xrightarrow{OH^-} [C_6H_5N{=}N{-}OH] \longrightarrow C_6H_5 + OH^\circ + N_2$$

Diazonium salt — Diazohydroxide

It is also quite possible that the diazohydroxide radical evolved from the alkaline reaction of the diazonium salt undergoes an ionic dissociation to form the diazotate ion, the latter reacting with non-dissociated diazonium salt to form the diazoanhydride. The free radical formation then occurs by dissociation of the diazoanhydride to yield phenyl and diazoxy free radicals, the latter reaction being accompanied by the evolution of nitrogen. The reaction sequence involved can be illustrated by the following equations.

(2)

a. $$C_6H_5{=}\overset{+}{N}{\equiv}N \rightleftarrows [C_6H_5{-}N{=}N{-}OH] \rightleftarrows C_6H_5{-}N{=}N{-}O^-$$

Diazonium salt — Diazohydroxide — Diazotate Ion b. $$C_6H_5{-}N{=}N{-}O^- + C_6H_5{-}\overset{+}{N}{\equiv}N \longrightarrow C_6H_5{-}N{=}N{-}O{-}N{=}N{-}C_6H_5$$

Diazotate Ion — Diazonium salt — Diazoanhydride c. $$C_6H_5{-}N{=}N{-}O{-}N{=}N{=}C_6H_5 \longrightarrow C_6H_5 + C_6H_5{-}N{=}N{-}O^\circ + N_2$$

Diazoandydride — Diazoxy Radical

Although the polymerization of the vinyl monomer can be initiated by any of the above depicted radical species, i.e., the phenyl-hydroxyl and diazoxy free radicals as well as the diazotate ion, experimental evidence would nevertheless indicate the predominant portion of the polymer forming reaction to be free radical induced. However, it is quite possible that polymerization proceeds by the superposition of both the free radical and ionic mechanisms. This hypothesis finds support in the published literature relating to studies conducted in connection with electrochemical methods of polymerization initiation. In this regard, reference is made to the article "Electrochemical Initiation of Polymerization" appearing in "Pure and Applied Chemistry" 4, p. 245 (1962). Accordingly, the term "polymerization initiating species" as used herein is to be so construed. In any event and regardless of the precise reaction or sequence of reactions involved, the salient fact remains that the electrolytically induced alkaline dissociation of the aforedescribed diazotized primary aromatic amines results in the formation of species capable of initiating the polymerization of vinyl type monomers whether the species be free radical, ionic or combinations of same.

In accordance with the discovery forming the basis of the present invention, it has been ascertained surprisingly that the aforedescribed catalyst-generating, electrolytically induced dissociation reaction can be accelerated synergistically by the employment of the light sensitive, diazonium primary aromatic amine in the form of the fluoborate and/or fluosilicate derivative specifically. Although the mechanism characterizing the electrolytically induced dissociation reaction(s) of the fluoborate and fluosilicate derivatives has not been definitely acertained and is not self-evident, the following hypothesis is nevertheless postulated.

Investigation establishes to a reasonable extent that the aforedescribed sequence of reactions involving the intermediate formation of base and the resultant reaction of such base with diazonium is involved; thus, like species of polymerization initiator are produced with the use of the fluoborate and fluosilicate diazonium derivatives. However, the rather significant increase in polymerization reaction rate obtainable with the specific catalyst systems described herein is in all likelihood attributable to the fact that further catalyst-producing dissociation reactions are involved, i.e., in addition to those described previously. For example, it is quite likely that the fluosilicate or fluoborate portion of the diazonium salt material contributes significantly to the polymerization reaction rate, i.e., significantly enhances the rate of polymer formation. This observation tends to find confirmation in various experiments involving the electrolysis of acrylamide monomer in aqueous solution in the presence of fluosilic or fluoboric acid. Thus, electrolysis of a solution of the following composition:

| | Gms. |
|---|---|
| Acrylamide | 180 |
| N,N'-methylenebisacrylamide | 7 |
| Water | 120 |

in the presence of a few drops of the fluosilic acid utilizing platinum electrodes resulted in the formation of polymer at the cathode in less than 10 seconds. Similar results are obtained with fluoboric acid. As will be readily apparent, the superposition of the various catalyst-producing reactions effectively increases the quantity of polymerization-initiator in accordance with the conductivity pattern thereby permitting the realization of greatly accelerated polymerization reaction rates. It is similarly believed that the acidified fluosilicate benzene diazonium derivative undergoes a somewhat similar sequence of dissociation reactions the net effect being increased catalyst quantities for given exposure levels.

In more practical terms, the benefits accruing therefrom are manifested in the form of significant reductions in required exposure to accomplish a predetermined level of polymerization, i.e., decreased time and/or intensity factors. Thus, it has been observed that for a given intensity light source favorable electrolytically induced polymerization reaction rates can be obtained despite the use of exposure times on the order of but half of those essential to efficacious commercial practice.

The vinyl monomers suitable for use in the practice of the present invention include broadly any of the normally liquid to normally solid ethylenically unsaturated organic monomer compounds conventionally employed in photopolymerization processes. Preferably, such compounds should contain at least one non-aromatic double bond between adjacent carbon atoms. Compounds particularly advantageous are the photopolymerizable vinyl or vinylidene compounds containing the $CH_2{=}C{<}$ grouping activated by direct attachment to an electro-negative group such as halogen, C=O, —C≡N, —C≡C, —O— etc. As examples of such photopolymerizable unsaturated organic compounds there may be mentioned in particular and without limitation, acrylamide, acrylonitrile, N-ethanol acrylamide, methacrylic acid, acrylic acid, calcium acrylate, methacrylamide, vinyl acetate, methylmethacrylate, methylacrylate, ethylacrylate, vinyl benzoate, vinyl pyrrolidone, vinylmethyl ether, vinylbutyl ether, vinylisopropyl ether, vinylisobutyl ether, vinylbutyrate, butadiene or mixtures of ethylacrylate with vinyl acetate, acrylonitrile with styrene, butadiene with acrylonitrile and the like.

The above ethylenically unsaturated organic compounds or monomers as they are more commonly referred to may be used either alone or in admixture in order to vary the physical properties such as molecular weight, hardness, etc. of the final polymer. Thus, it is a recognized practice, in order to produce a vinyl polymer of the desired physical properties to polymerize in the persence of a small amount of an unsaturated compound containing at least two terminal vinyl groups each linked to a carbon atom in a straight chain or in a ring. The function of such compounds is to cross-link the polyvinyl chain. This technique, as used in polymerization, is further described by Kropa and Bradley in Vol. 31, No. 12 of Industrial and Engineering Chemistry, 1939. Among the cross-linking agents suitable for the purposes described herein there may be mentioned N,N'-methylene-bis-acrylamide, triacrylformal, triallyl cyanurate, divinyl benzene, divinyl ketones, diglycol diacrylate and the like. Generally speaking, increasing the quantity of cross-linking agent increases the hardness of the polymer obtained in the range wherein the weight ratio of monomer to cross-linking agent varies from 10:1 to 50:1.

In some instances, it may be desirable to employ an organic hydrophilic colloid carrier for the monomer/catalyst composition such as the type commonly used in the photographic art. Suitable colloid carriers for this purpose include without limitation polyvinyl alcohol, gelatin, casein, glue saponified cellulose acetate, carboxymethyl cellulose, starch and the like. Preferably, the colloid is employed in amounts ranging from 0.5 to 10 parts by weight per part of monomer. It will be understood, however, that the monomer/catalyst composition may be applied as such, i.e., in the absence of a colloidal carrier, e.g., where the monomer employed is normally a solid. In such instances, the catalyst may be added to a pre-prepared solution of monomer in a suitable solvent prior to application to the support material. It has also been observed that the organic colloid likewise undergoes insolubilization and thus forms a portion of the resist matrix. This phenomenon is particularly manifest with gelatin. Thus, the colloid carrier need not be inert in the sense of being totally unaffected by the catalytic effects of the polymerization-initiating species generated during the exposure intervals.

The significance of the above illustrated reaction mechanism within the specific context of the persent invention can be amplified as follows. The situs of the initial polymer build-up, i.e., at the support-monomer layer interface or conversely, the monomer layer-photoconductor layer interface will, of course, depend upon the relative polarity of the support and the conductive surface of the Nesa brand glass (PPG Industries, Inc.). Since the free radical generating reaction characterizing the electrolytically induced dissociation of the diazo compound is essentially cathodic in nature, the equivalent of a base-side exposure utilized in photopolymerization techniques whereby polymer build-up occurs at the support-monomer layer interface can be readily achieved by merely making the support the cathode terminal. This particular embodiment is, of course, imperative in processes involving the formation of continuous tone, polymeric relief images by wash-out development whereby unpolymerized monomer is removed. In formulating the vinyl monomer, layer-forming compositions of the persent invention, it is usually required that sufficient acid stabilizer be incorporated to maintain an acid pH, i.e., a pH value below 7. Any of the acid materials promulgated in the diazotype art for such purposes are eminently suitable herein; in general, such acids are of the organic carboxylic variety with specific representatives including for example, citric acid, tartaric acid, oxylic acid, succinic acid and the like. As will be recognized the quantity of acid stabilizer added will influence the overall sensitivity of the system, i.e., excess acidity will promote neutralization of the electrolytically generated base, i.e., hydroxyl, with a concomitant retardation of the diazonium compound dissociation reaction. For optimum results, it is recommended practice that the pH of the monomer coating be maintained at a value ranging from 3 to 4 with values approximating 3.5 being particularly preferred. Within the foregoing range it has been determined that the system sensitivity is not adversely affected.

Additional ingredients may be added to the monomer compositions if desired for purposes of achieving optimum coating viscosities. Thus, for example, one or more humectants may be included and preferably the organic polyhydroxy compounds, e.g., ethylene glycol, propylene glycol, dipropylene glycol and the like. The nature of any such auxiliary ingredient is not particularly critical with the obvious limitation that the monomer composition be not adversely affected thereby.

Electropolymerization of the vinyl monomer compositions described herein results in the formation of a readily visually detectable color, i.e., darkening or tanning in the polymerized areas thus differentiating the image areas from the background, unpolymerized areas. If desired, image coloration can be augumented by the incorporation of a suitable coupler material in the polymerizable coating such that the electrolytic formation of base serves not only to initiate vinyl monomer polymerization but in addition, provides the alkaline environment necessary for the dye-forming coupling reaction. Color coupling components which so function are well known in the art and in general may be selected from any of those employed in the production of two-component light-sensitive diazotype compositions, i.e., the so-called dry process diazotype compositions. Naturally, the selection of a particular coupling component would depend primarily upon the coloration desired in the final polymeric image.

The process of the present invention may be employed to advantage in any number of commercial applications. Thus, it may be employed to produce relief printing plates, negative working off-set plates and the like. For example, if the coupling component is omitted from the vinyl monomer layer, the image density can be enhanced, following polymer formation, by staining the resist with black or colored inks, dyestuffs, etc. Moreover, improved contrast can be obtained by dispersing a colloidal carbon in the monomer composition. Conversely, a white pigment such as a titanium dioxide can be included in the monomer layer, the latter being thereafter coated upon a black conducting surface such as a carbon coated film support. In this manner, negatives or positives for direct inspection can be produced merely by removing the unpolymerized non-image areas.

In addition to the above uses, the present invention can be extended to the preparation of printing materials, image transfer materials, printing masks, photolithographic printing plates of all types, lithographic cylinders, printing stencils, printed circuits, etc.

The polymerizable vinyl monomer composition thus produced can be readily applied to the conductive base material by any suitable coating operation, e.g., flow coating.

It is preferred that the vinyl monomer composition be deposited upon the conductive support to a thickness within the range of from about 5 to about 100 microns. Although the thickness of the layer thus deposited is not particularly critical, it should nevertheless be maintained within the aforestated range in order to assure the obtention of optimum results. In general, thinner coatings produce higher photocurrents and are thus conducive to higher speed resist formation.

Any conductive support may be employed as the base for the vinyl monomer coating, it only being necessary that electrical contact be established with the conductive surface during the exposure. Thus, for example, a carbon coating may be used on conventional film base supports. Metal, e.g., aluminum, may also be used as the conductive medium on which the electropolymerizable layer is coated. In addition, paper may be rendered electrically conductive by impregnation with carbon particles or by incorporation of suitable electrolytes at the time of manufacture. The support for the photoconductive coating may be glass or plastic on which is vacuum-evaporated or otherwise deposited a very thin film of metal or metal oxide such as electrically conducting glass commercially available and known as NESA brand glass (PPG Industries, Inc.). In the latter case, it is desirable that the metal layer be thin enough so that it is at least 70% to 75% transparent to light.

The thickness of the conductive support is likewise not particularly critical so long as the surface in contact with the monomer layer be suitably conductive. In general, it is found that optimum results can be obtained by selecting as the conductive base a material having a resistivity of less than 130 ohm-cm.

The nature of the photoconductive insulating layer (layer C in FIG. 2) is likewise not a critical factor in the practice of the present invention so long as it possesses a high dark resistivity on the order of at least $10^{10}$ ohm-cm. and of course, that it be rendered conductive when exposed to electromagnetic radiation having a wave length ranging from the ultraviolet through the visible region of the spectrum. Such materials are, of course, well known in the art. As examples of photoconductive insulating layers suitable for use herein there may be mentioned in particular and without limitation vacuum evaporated vitreous selenium and mixtures of insulating resins with photoconductors selected from the class of inorganic luminescent or phosphorescent compounds such as zinc oxide, zinc sulfide, zinc cadmium sulfide, cadmium sulfide and the like. These compounds may be suitably activated in well known manner with manganese, silver, copper, cadmium, cobalt, etc. Examples of these include mixed cadmium-sulfide zinc-sulfide phosphors, formerly commercially available from the New Jersey Zinc Company under the names Phosphor 2215, Phosphor 2225, Phosphor 2304, and zinc sulfide phosphors under the names Phosphor 2200, Phosphor 2205, Phosphor 2301, and Phosphor 2330, also copper activated cadmium sulfide and silver activated cadmium sulfide available from the U.S. Radium Corporation under the names cadmium sulfide color number 3595 and cadmium sulfide number 3594, respectively, also zinc oxide available from the New Jersey Zinc Co., under the trade name Florence Green Seal No. 8 and zinc oxide available from the St. Joseph Lead Co. under the trade name St. Joe Zinc Oxide Grade 320–PC. As is well known, the zinc oxide normally employed in such photoconductive layers has its greatest sensitivity in the ultraviolet region of the spectrum whereas conventional light sources have relatively weak radiation in the same region. However, the sensitivity of the zinc oxide may be extended to the visible region of the spectrum by the incorporation of suitable sensitizing dyes capable of imparting response or sensitivity to the longer wave length radiation. Particularly beneficial results are obtained with the use of photoconductor materials commercially available from Sylvania bearing the trade name designations PC–100, PC–102 and PC–103. These materials comprise doubly activated photoconductors and are described as follows:

PC–100, a photoconductor comprising luminescent grade cadmium sulfide activated with copper and co-activated with chloride; PC–102, a photoconductor comprising cadmium sulfoselenide activated with copper and co-activated with chloride, PC–103, identical with PC–100 except that it has been granulated to impart free-flowing characteristics.

The foregoing photoconductor materials are particularly preferred for use herein since they exhibit a peak spectral response substantially co-extensive with that of the human eye, i.e., display a peak sensitivity to visible electromagnetic radiation, the response characteristics tapering off towards the ultraviolet and the infra-red. Moreover, such photoconductor materials are eminently suitable in the practice of the present invention whether they serve as the anode or cathode of the system.

As examples of insulating binders found to be eminently suitable for the preparation of the photoconductive layer, mention may be made of the silicone resins such as DC–801, DC–804, and DC–996, manufactured by the Dow Corning Corporation, and SR–82, manufactured by the General Electric Corporation; acrylic and methacrylic ester polymers such as Acryloid A 10 and Acryloid B 72 supplied by the Rohm and Haas Co.; epoxy ester resins such as Epidene 168, sold by the T. F. Washburn Corp., etc.

As mentioned hereinbefore, the principal advantage made possible by the present invention relates to the manifold increase in speed obtainable by virtue of the fact that the incident exposure light energy is converted into electric energy and thereafter amplified to the extent desired in accordance with the particular speed requirements of the process. More specifically, the incident light is converted into charge carriers (current) by the photoconductor layer.

Without intending to be bound by any theory, it has nevertheless been postulated in explanation of the amplifying characteristics of photoconductors that such materials when excited by the impingement of light rays function in a manner comparable to the operation of an electric amplifying device whereby one quantum of light energy (photon) can be converted into more than one charge carrier. The measure of this conversion is gain (G) which is defined as the number of charge carriers that pass between the electrodes per second for each photon of light energy absorbed per second. Gain values for the electrophotopolymerizable systems provided herein are found to be greater than unity. In essence then, the utilization of light energy to produce electric current which in turn generates polymerization initiator via the electrolysis of electrochemical catalyst material represents an amplification step. The gain value is, of course, indicative of the degree of amplification. Thus, if a gain value of 100 is representative of a given electrophotopolymerizable system, this would signify the formation of about 100 polymerization initiating species from one photon of light energy.

The amplifying characteristics of the crystals comprising the photoconductor is probably due to the fact that such materials, e.g., doubly activated cadmium sulfide, cadmium sulfoselenide and the like comprise excess electron or electron donor type semi-conductor crystals. As a consequence, the excess energy necessary to produce the amplifier current in the crystal is derived from the electron producing character of the material itself when irradiated by exposure to light rays. It is thought that electron donor centers in each crystal are ionized by the light rays thus forming stationary positive space charges. In the crystal the conduction electrons are to a large extent localized in the traps, thus forming the current reducing stationary negative space charge. When the ray impinges the electron donors are ionized thus assuming a positive charge. One positive hole so created in the crystal appears to control the flow of more than 10,000 electrons through the crystal. Consequently electrical energy is released in the form of current in the crystal that is many times the energy applied to the crystal by the light ray.

The following examples are given for purposes of illustrating the present invention in greater detail. However, it is to be understood that such examples are presented for purposes of illustration only and accordingly, are not to be regarded as limiting the invention.

EXAMPLE I

The following monomer composition was prepared:

| | Gms. |
|---|---|
| Acrylamide (recrystallized) | 180.0 |
| N,N'-methylenebisacrylamide | 7.0 |
| Water | 120.0 |

To 3 milliliters of the above composition were added the following ingredients in the amounts shown:

| | | |
|---|---|---|
| Aqueous polyvinyl alcohol (Elvanol 51–05) 20% | ml | 25 |
| Triethylene glycol | ml | 0.5 |
| p-morpholinobenzenediazonium fluoborate | mg | 100.0 |
| Citric acid | mg | 100.0 |

The mixture was flow coated on a thin aluminum sheet and allowed to dry in a darkroom. This coating constituted the electropolymerizable layer.

A dye sensitized zinc oxide photoconductive layer, approximately 60 microns thick, was next deposited on a sheet of NESA brand glass (PPG Industries, Inc.) and allowed to dry in air for about 15 minutes, followed by making in a 100° C. oven for one hour. The binder employed was GE Silicone Resin SR–82, and a mixture of toluene and methanol was used as solvent to adjust the mixture to the proper viscosity for coating. The photoconductive surface was then placed in intimate contact with the electropolymerizable layer. A 375-watt photofloor lamp was next positioned approximately 16 inches from the glass side of the photoconductive element and a 7–8 second exposure made through a photographic line negative while simultaneously passing a current of 50 milliamperes at 200 volts through the assembly. The aluminum support was made the anode and the conducting surface of the NESA glass served as the cathode. At the end of the exposure, a dark brown polymeric positive image was obtained against the very light brown background of the non-electrolyzed, i.e., non-polymerized areas.

EXAMPLE II

The arrangement was similar to Example I except that (1) a continuous-tone photographic negative was substituted for the line negative, (2) the lamp was placed at a distance of 11 inches from the glass side of the photoconductive element, (3) the exposure was of 5 seconds duration, and (4) a current of 150 milliamperes at 200 volts was employed. After exposure, a dark brown polymeric continuous-tone positive image was obtained against the lighter brown background on the non-electrolyzed, i.e., non-polymerized areas.

EXAMPLE III

Example I is repeated except that the diazonium compound employed comprises the fluosilicate salt of diazotized 4-diethylaminoaniline.

EXAMPLE IV

Example I is repeated except that the diazonium compound employed comprises the fluosilicate salt of diazotized 4-cyclohexylaminoaniline.

EXAMPLE V

Example I is repeated except that the diazonium compound employed comprises the fluoborate salt of diazotized 4-piperidinoaniline.

EXAMPLE VI

Example I is repeated except that the diazonium compound employed comprises the fluosilicate salt of diazotized 4-thiomorpholinoaniline.

EXAMPLE VII

Example I is repeated except that the diazonium compound employed comprises the fluoborate salt of diazotized N-$\beta$-hydroxyethyl-N-ethyl-p-phenylene diamine.

EXAMPLE VIII

Example I is repeated except that the diazonium compound employed comprises the fluosilicate salt of diazotized benzene-2,2'-disulfonic acid.

EXAMPLE IX

Example I is repeated except that the diazonium compound employed comprises the fluoborate salt of diazotized 6-amino-4-benzoylamino-1,3-dimethoxybenzene.

In each of the above examples, there is obtained upon termination of the exposure a dark brown polymeric positive image against a very light brown background of the non-electrolyzed, i.e., non-polymeric areas.

Results similar to those described above are obtained when the procedures exemplified are repeated but employing in lieu of acrylamide the following materials:

Methacrylic acid
Acrylic acid
Calcium acrylate
Methacrylamide
Vinyl acetate
Acrylyl pyrrolidone
Vinyl pyrrolidone, etc.

The present invention has been disclosed with respect to certain preferred embodiments thereof, and there will be obvious to persons skilled in the art modifications, equivalents or variations thereof which are intended to be included within the spirit and scope of this invention.

What is claimed is:

1. A process of photoelectropolymerization which comprises exposing a photoconductor layer having a high dark resistivity to electromagnetic radiation having a wave length extending from the ultraviolet through the visible region, said photoconductor layer being disposed in electrically conducting contact with a vinyl monomer layer coated on an electrically conductive support, said monomer layer comprising (a) a normally liquid to normally solid vinyl monomer containing the grouping $CH_2{=}C{<}$ attached directly to an electronegative group and (b) a catalyst progenitor comprising a compound which undergoes electrolysis upon passage of an electric current with the formation of polymerization-initiating species capable of initiating the polymerization of said vinyl monomer, said catalyst liberating material comprising a compound selected from the group consisting of the fluoborate and fluosilicate salts of a radiation sensitive diazotized primary aromatic amine and wherein an electrical potential difference is maintained across said photoconductive layer and said conductive support throughout the exposure interval, said potential difference being substantially uniformly distributed over each of said photoconductor layer and said conductive support whereby current is caused to flow through said monomer layer thereby effecting polymerization of the said vinyl monomer layer.

2. A process according to claim 1 wherein said vinyl monomer comprises acrylamide.

3. A process according to claim 1 wherein said catalyst liberating material comprises the fluoborate salt of diazotized p-morpholino aniline.

4. A process according to claim 1 wherein said catalyst liberating material comprises the fluosilicate salt of diazotized 4-diethylaminoaniline.

5. A process according to claim 1 wherein said catalyst liberating material comprises the fluosilicate salt of diazotized 4-cyclohexylaminoaniline.

6. A process according to claim 1 wherein said catalyst liberating material comprises the fluoborate salt of diazotized 4-piperidinoaniline.

7. A process according to claim 1 wherein said catalyst liberating material comprises the fluosilicate salt of diazotized 4-thiomorpholinoaniline.

8. A process according to claim 1 wherein said catalyst liberating material comprises the fluoborate salt of diazotized N-$\beta$-hydroxyethyl-N-ethyl-p-phenylene diamine.

9. A process according to claim 1 wherein said catalyst liberating material comprises the fluosilicate salt of diazotized benzidine-2,2'-disulfonic acid.

10. A process according to claim 1 wherein said catalyst liberating material comprises the fluoborate salt of diazotized 6 - amino - 4 - benzoylamino - 1,3 - dimethoxybenzene.

11. A process for the preparation of a polymeric resist image wherein polymer formation is controlled in accordance with an imagewise conductivity pattern which comprises exposing imagewise a photoconductive layer having a high dark resistivity to electromagnetic radiation having a wave length extending from the ultraviolet through the visible region whereby said photoconductive layer is rendered capable of conducting an electric current in the exposed areas, said photoconductive layer being disposed in electrically conducting contact with a vinyl monomer layer coated on an electrically conductive support, said monomer layer comprising (a) a normally liquid to normally solid vinyl monomer containing the grouping $CH_2{=}C{<}$ attached directed to an electronegative group and (b) a catalyst progenitor comprising a compound which undergoes electrolysis upon passage of an electric current with the formation of species capable of initiating the polymerization of said vinyl monomer, said catalyst liberating material comprising a compound selected from the group consisting of the fluoborate and fluosilicate salts of a radiation sensitive diazotized primary aromatic amine and wherein an electrical potential difference is maintained across said photoconductive layer and said conductive support throughout the exposure interval, said potential difference being substantially uniformly distributed over each of said photoconductor layer and said conductive support whereby current is caused to flow through said monomer layer thereby effecting polymerization of the said vinyl monomer in areas corresponding to the exposed areas of said photoconductor layer, and removing the unpolymerized portions of said monomer layer to form a polymeric resist image.

12. A process according to claim 11 wherein said catalyst liberating material comprises the fluoborate salt of diazotized p-morpholino aniline.

13. A process according to claim 11 wherein said catalyst liberating material comprises the fluosilicate salt of diazotized 4-diethylaminoaniline.

14. A process according to claim 11 wherein said catalyst liberating material comprises the fluosilicate salt of diazotized 4-cyclohexylaminoaniline.

15. A process according to claim 11 wherein said catalyst liberating material comprises the fluoborate salt of diazotized 4-piperidinoaniline.

16. A process according to claim 11 wherein said catalyst liberating material comprises the fluosilicate salt of diazotized 4-thiomorpholinoaniline.

17. A process according to claim 11 wherein said catalyst liberating material comprises the fluoborate salt of diazotized N - β - hydroxyethyl - N - ethyl - p - phenylene diamine.

18. A process according to claim 11 wherein said catalyst liberating material comprises the fluosilicate salt of diazotized benzidine-2,2′-disulfonic acid.

19. A process according to claim 11 wherein said catalyst liberating material comprises the fluoborate salt of diazotized 6 - amino - 4 - benzoylamino - 1,3-dimethoxybenzene.

20. A process according to claim 11 wherein said monomer layer further contains a cross-linking agent comprising a compound containing at least two terminal vinyl groups.

References Cited

UNITED STATES PATENTS

| | | | |
|---|---|---|---|
| 2,306,471 | 12/1942 | Solomon | 96—91X |
| 2,459,521 | 1/1949 | Grieg | 96—91UX |
| 3,110,592 | 11/1963 | Schwerin et al. | 96—115PX |
| 3,138,460 | 6/1964 | Levinos | 96—115PX |
| 3,409,431 | 11/1968 | Deutsch | 96—35.1 |
| 3,436,215 | 4/1969 | Levinos et al. | 96—35.1X |

DAVID KLEIN, Primary Examiner

U.S. Cl. X.R.

96—91, 115; 204—159.23

Disclaimer

3,600,173.—*Steven Levinos,* Vestal, N.Y. PHOTOELECTROPOLYMERIZATION. Patent dated Aug. 17, 1971. Disclaimer filed Sept. 30, 1982, by the assignee, *Eastman Kodak Co.*

Hereby enters this disclaimer to all claims of said patent.

[*Official Gazette March 22, 1983.*]